United States Patent
Cantatore et al.

(10) Patent No.: US 8,489,198 B2
(45) Date of Patent: Jul. 16, 2013

(54) ANTENNA SYSTEM WITH SAFETY MODE

(75) Inventors: Eugenio Cantatore, Eindhoven (NL); Robert Paul Kleihorst, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 469 days.

(21) Appl. No.: 12/596,868

(22) PCT Filed: Apr. 21, 2008

(86) PCT No.: PCT/IB2008/051525
§ 371 (c)(1),
(2), (4) Date: Oct. 21, 2009

(87) PCT Pub. No.: WO2008/132653
PCT Pub. Date: Nov. 6, 2008

(65) Prior Publication Data
US 2010/0131033 A1      May 27, 2010

(30) Foreign Application Priority Data
Apr. 27, 2007  (EP) .................................... 07107139

(51) Int. Cl.
*A61N 1/00*      (2006.01)
*A61F 2/02*      (2006.01)

(52) U.S. Cl.
USPC ............... 607/60; 607/30; 607/32; 623/11.11

(58) Field of Classification Search
USPC .............................. 607/30, 32, 60; 623/11.11
See application file for complete search history.

(56) References Cited

U.S. PATENT DOCUMENTS

| | | | |
|---|---|---|---|
| 4,614,192 A * | 9/1986 | Imran et al. .................... 607/5 |
| 5,278,505 A | 1/1994 | Arakawa | |
| 6,229,443 B1 | 5/2001 | Roesner | |
| 6,348,070 B1 * | 2/2002 | Teissl et al. ................ 623/11.11 |
| 7,091,806 B2 | 8/2006 | Zimmerling et al. | |
| 7,123,013 B2 | 10/2006 | Gray | |
| 2004/0267233 A1 | 12/2004 | Ginggen | |

FOREIGN PATENT DOCUMENTS

| | | |
|---|---|---|
| JP | 2000123124 A | 4/2000 |
| JP | 2004312431 A | 11/2004 |

* cited by examiner

*Primary Examiner* — Nicole F Lavert

(57) ABSTRACT

An antenna system for an implantable device like a cardiac pacemaker or a cochlear implant. The antenna system includes at least two coil units coupled with their terminals to a control circuit which can selectively connect the coil units in series or in anti-series, corresponding to a "operational mode" and a "safety mode", respectively. In the operational mode, magnetically induced voltages in the coil units add, while they subtract and therefore completely or partially compensate in the safety mode. Thus the implantable device can be protected from damage due to extraordinarily large changing rates of external magnetic fields as they exist for example during MRI examinations.

12 Claims, 3 Drawing Sheets

ANTENNA SYSTEM WITH SAFETY MODE

The invention relates to an antenna system for an implantable device that can be put in a safety mode as well as an antenna arrangement and an implantable device comprising such an antenna system. Moreover, it relates to a mode selection device, an MRI device, and a method for controlling such an antenna system.

The U.S. Pat. No. 6,348,070 B1 discloses an antenna system for cochlear implants that consists of two coils of identical design arranged side-by-side that are connected in such a way that voltages induced by spatially homogeneous magnetic fields oppose each other. Thus damages to the implant due to excessive voltages or currents induced for example during a Magnetic Resonance Imaging (MRI) procedure can be avoided. Nevertheless the desired transfer of energy to the antenna system via an external radio frequency (RF) sender is still possible as long as the latter generates a spatially inhomogeneous magnetic field in the region covered by the coils.

Based on this background it was an object of the present invention to provide means for a more versatile protection of implanted devices with an antenna system against damages from excessive external magnetic fields.

This object is achieved by an antenna system according to claim 1, by an antenna arrangement according to claim 8, by an implantable device according to claim 9, by a mode selection device according to claim 10, by an MRI device according to claim 11, and by a method according to claim 12. Preferred embodiments are disclosed in the dependent claims.

The antenna system according to the first aspect of the invention is intended for an implantable device, though it may of course be used in other applications, too, in which its advantageous features are required. In an implantable device, the antenna system will typically serve as a receiver or sender for information carrying signals and/or for the reception of electrical energy that is needed to drive or charge the implantable device. The antenna system comprises the following components:

a) At least two different coil units, each of which has two electrical terminals. The term "coil unit" shall denote in this context any arrangement of electrical leads which electrically connect an input terminal with an output terminal and which is such that an electrical voltage is induced between these terminals if the coil unit is placed in a (properly oriented) changing external magnetic field. Usually, the coil units comprise one or more loops with e.g. a circular or rectangular cross section consisting of a wire.

b) A control circuit for selectively switching between an "operational mode" and a "safety mode", wherein the coil units are in the operational mode connected in series with respect to voltages induced in them by a given magnetic field, while they are connected in anti-series in the safety mode. In this context a "connection in series" means that two terminals of the coil units (one of each coil unit) are connected in such a way that the voltages induced in these coil units by the given (time-variable) magnetic field will add to a total voltage of larger magnitude; this is tantamount to saying that the low-potential terminal of the first coil unit is connected to the high-potential terminal of the second unit or vice versa. Connection in "anti-series", on the contrary, means that two terminals (one of each coil unit) are connected in such a way that the voltages induced in these two coil units by the given magnetic field will partially or completely cancel, i.e. yield a total voltage at the remaining free terminals which is smaller in magnitude than the largest of the single two voltages; this is tantamount to saying that the low-potential terminals or alternatively the high-potential terminals of the first and the second coil unit are connected.

The antenna system has the advantage that, depending on the mode selected by the control circuit, the coupled coil units generate in a time variant external magnetic field a maximal (operational mode) or minimal (safety mode) voltage. Thus it is particularly possible to protect the implantable device from damage in an excessively high external magnetic field as it is for example encountered during an MRI examination.

In many cases the coil units can be characterized by a "coil area vector", wherein the scalar product of such a coil area vector with the magnetic field vector that prevails within the area of the coil unit yields the magnetic flux through the coil unit. In the practically important case of coil units consisting of identical, e.g. circular or rectangular loops of a wire, the coil area vector corresponds to a vector that is orthogonal to the loop area and has a magnitude proportional to the size of the area. The orientation of the coil area vector is determined by convention with respect to a predefined "positive" current direction within the wire, e.g. via a "right-hand-rule"; this orientation is directly linked to the sequence in which the electrical potentials at the terminals of the coil units have to be subtracted from each other to yield the voltage between these terminals with the proper sign.

If the coil units can be characterized by such coil area vectors, these vectors are preferably parallel to each other and/or equal in magnitude (wherein it should be noted that the term "parallel" shall in the present context not comprise any statement with respect to an orientation). Both conditions are for example given if the coil units are equally dimensioned (e.g. with equal numbers of circular loops of equal size) and arranged in parallel planes. The coil units may particularly be disposed in line or side-by-side with respect to their coil area vectors. Parallel and equally long coil area vectors have the advantage that the induced voltages in the two coil units can exactly cancel in the safety mode when the antenna system is exposed to a spatially homogeneous magnetic field.

There are different ways in which the control circuit can determine when to switch between the safety mode and the operational mode. In a first variant, the control circuit comprises a receiver for receiving external commands, said commands making it switch on or off the safety mode or the operational mode. Thus the antenna system may for example be switched into the safety mode for the time it is exposed to an excessive external magnetic field, e.g. during an MRI examination. Alternatively, the antenna system may be switched into the operational mode for the time a transmission of information signals or of electrical energy takes place. The receiver may preferably be adapted to receive the commands without a wired connection to the external sender, for example as wirelessly sent electromagnetic waves or as electrical currents generated by an external device using the conductivity of the human body.

In another variant, the control circuit comprises a sensor unit for detecting some effect caused by external magnetic fields, e.g. for detecting directly the field strength or for detecting a flux variation caused by the field. Thus the control circuit can base its switching actions on information about the magnetic fields prevailing in the coil units.

In a particular embodiment of the aforementioned approach, the control circuit comprises a sub-circuit for switching into the safety mode if the sensor unit detects an external magnetic field crossing a given threshold in at least one of its characteristic parameters. The sensor unit may for example detect if the changing rate of an external magnetic field exceeds a predetermined threshold, whereupon the sub-circuit may trigger an automatic transition to the safety mode to protect the implantable device from damages.

In still another embodiment of the invention, the control circuit comprises a timer for triggering a return to the safety mode a predetermined time after the start of an operational mode. Thus the safety mode will be a kind of default state which is automatically assumed by the antenna system if no other external commands are given.

According to a further development of the invention, the antenna system comprises an identifier module that allows a wireless identification of the antenna system by external devices. In this case external devices can detect the presence of an antenna system that is switchable between a safety mode and an operational mode, thus providing for example the possibility to switch this system into the safety mode when a procedure involving high magnetic field strengths is started. The identifier module may optionally be realized by a radiofrequency identifier device (RFID).

The invention further relates to an antenna arrangement for an implantable device that comprises at least two antenna systems of the kind described above, i.e. antenna systems with at least two coil units and a control circuit for selectively switching between an operational mode (coil units in series) and a safety mode (coil units in anti-series). The antenna arrangement is further characterized in that the coil units of each antenna system have parallel coil area vectors and that the coil area vectors of different antenna systems are non-parallel. The antenna systems that constitute the antenna arrangement will then favorably have different directions of their maximal magnetic sensitivity (which is defined by the corresponding coil area vectors).

The invention further comprises an implantable device, particularly a cardiac pacemaker, a neurostimulator, a drug pump, or a cochlear implant. The implantable device is characterized in that it comprises an antenna system of the kind described above, i.e. an antenna system with at least two coil units and a control circuit for selectively switching between an operational mode (coil units in series) and a safety mode (coil units in anti-series).

The invention further comprises a mode selection device having a command module for wirelessly commanding an antenna system of the kind described above into its safety mode or into its operational mode, i.e. an antenna system with at least two coil units and a control circuit for selectively switching between an operational mode (coil units in series) and a safety mode (coil units in anti-series). The mode selection device thus allows for a limited control over antenna systems that provide a safety mode and an operational mode as well as means for receiving external commands that trigger a transition into the safety mode and/or the operational mode. Thus security systems used at airports or theft protection systems used in retail stores may for example be equipped with such a mode selection device to protect persons with implantable devices from damage due to excessive magnetic fields generated by the security system.

The invention further relates to a magnetic resonance imaging (MRI) device with a mode selection device of the aforementioned kind. As MRI devices generate magnetic fields with high temporal gradients, they pose a considerable threat to the implants in patients. It is therefore a considerable progress in terms of safety, if MRI devices can switch such implants into a safety mode in which the implants cannot be damaged. In many cases, the MRI examination would even not be possible without such a transition into a safety mode.

Finally, the invention relates to a method for controlling the antenna system of an implantable device, wherein said antenna system has at least two different coil units and wherein the method comprises the selective switching between a "operational mode", in which the coil units are connected in series with respect to voltages induced by a given magnetic field, and a "safety mode", in which the coil units are connected in anti-series with respect to said induced voltages.

The method comprises in general form the steps that can be executed with an antenna system of the kind described above. Therefore, reference is made to the preceding description for more information on the details, advantages and improvements of that method.

These and other aspects of the invention will be apparent from and elucidated with reference to the embodiment(s) described hereinafter. These embodiments will be described by way of example with the help of the accompanying drawings in which.

Like reference numbers in the Figures refer to identical or similar components.

Figure 1:
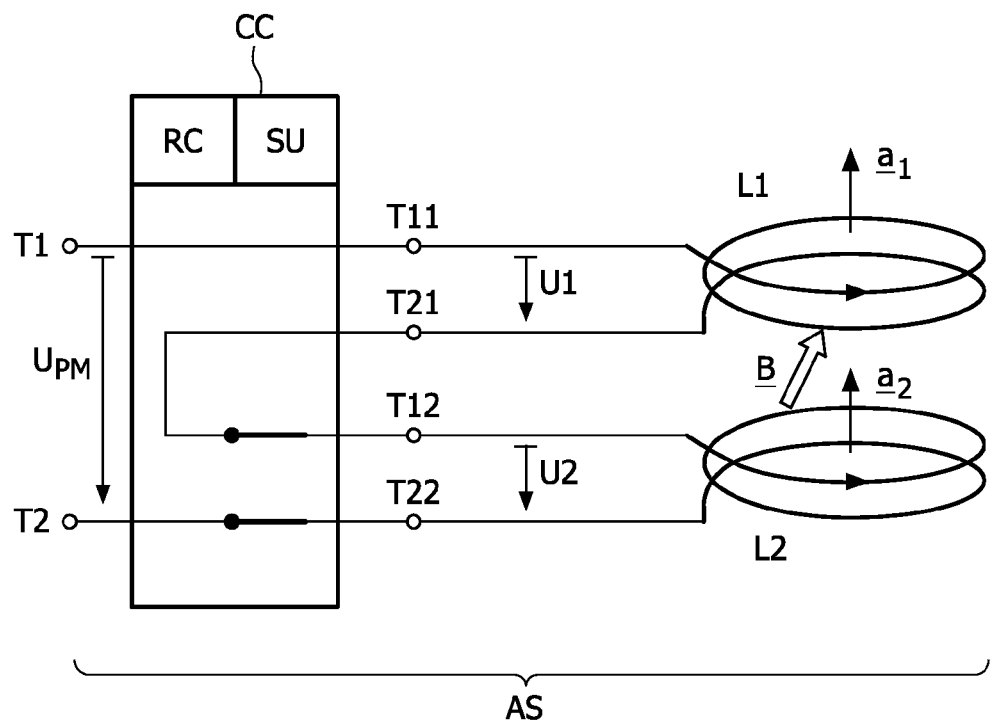
FIG. 1 shows schematically two coil units arranged in line and connected in series for an operational mode.

Many implanted therapeutic devices comprise a method to send electric power from a recharging device placed outside the body to the implant itself. Often this method consists in generating a variable magnetic field outside the body that is captured by a "loop antenna" (i.e. an inductor coil) placed inside the body and connected to the implant. As can be derived from Faraday's law of induction, the voltage V obtained at the terminals of a coil with N loops immersed in a field constant over its area is equal to $$V = -N \cdot d\Phi/dt, \qquad (1)$$

where $\Phi = B \cdot A$ is the magnetic flux through the coil of flux surface A with B being the magnetic field, or magnetic field density. Coupling a varying magnetic field to an inductor coil one can thus generate a voltage at the antenna ends, and transmit electric power to the implant.

A problem of the described antennas is that unwanted high voltages V can be generated between the terminals of the coil when the magnetic flux through the coil varies rapidly and the coil terminals are kept in open circuit. If the coil is connected to other electric components, the large voltages across the coil may result in large currents. All these situations may damage the implantable device and cause even discomfort or hazard to the patient (e.g. burns due to local heating). This can happen, for instance, when a patient carrying the implantable therapeutic device undergoes an MR examination.

During MR examination the patient is exposed to three different kinds of magnetic fields:

A large static magnetic field (up to 3 T and more). This field may generate flux variation through the coil when the patient is moved in and outside the imaging equipment.

A gradient field that is applied to obtain spatial information needed to build MR images. The magnetic field variation due to gradient field are typically up to dB/dt=200 T/s.

RF fields applied at the Larmour frequency during MR imaging, which have a magnetic component $B = b \cdot \sin(\omega t) = b \cdot \sin(2\pi f t)$. The magnitude of this component can be up to b=33 µT (and f=64 MHz for a 1.5 T system) in the imaging volume. Analysis shows that there are local regions (e.g. the patient's arms) where the field is above six times the ISO-center value of the rotating field and reaches thus a magnitude of 6·33 µT≈200 µT. The maximum open-circuit voltage V generated at the terminal of a N=10 turns, round coil having an air core and a radius of 1 cm would then be V=ω·N·A·b=41V in a region where the RF field magnitude is 33 µT and even V=252V for a coil located e.g. in the periphery. These voltage levels can be hazardous for the device and the patient.

On top of the safety problems described, if the coil is not kept in open circuit and a large current can flow through the coil as a response to the rapid variation in magnetic flux, the coil itself will generate magnetic fields that may cause artifacts on the MR image or too high local SAR (Specific Absorption Rate, expressed in Watt per kilogram, i.e. the amount of spatially distributed power dissipated in (human) tissue) near the implant. Due to the high local RF field gradients, the probability to have a region inside the patient that is properly excited is relatively high. If that region coincides with a magnet and gradient condition that is in the acquired k-space, tissue outside the imaging region may fold back into the image.

In order to address the above problems, it is proposed here to use at least two coil units that can be switched into a "operational mode", in which they are connected in series, i.e. such that voltages induced in the coil units add, and a "safety mode" in which they are connected in anti-series, i.e. such that voltages induced in the coil units subtract. FIG. 1 shows schematically such an antenna system AS comprising—as particular embodiments of such "coil units"—two coils L1 and L2 of identical design (i.e. identical circular cross section and number N of wire loops) with the terminals T11, T21 and T12, T22, respectively. The terminals of the coils are connected to a control circuit CC that can selectively connect the two coils in (at least) two different modes:

1 An "operational mode", which is used when RF power transfer to the antenna system AS is needed. As shown in FIG. 1, the two coils L1, L2 are electrically connected in series in this mode while having the same magnetic flux, i.e. terminal T21 will be connected to terminal T12. The coil area vectors $a_1$ and $a_2$ are parallel and have the same directions, so that the voltages U1, U2 induced in the individual coils L1 and L2 constructively add. Power will be received between the remaining free terminals T11 and T22 of the coils, which are put through to the output terminals T1, T2 of the control circuit CC.

Figure 2:
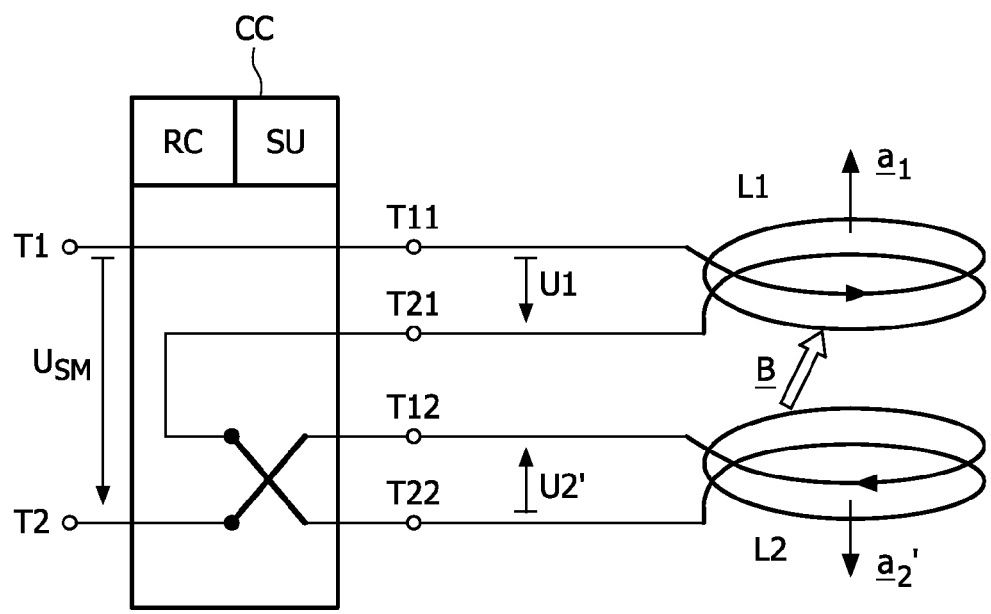
FIG. 2 shows the two coil units of FIG. 1 connected in anti-series in a safety mode.

2. A "safety mode", which is assumed when no RF transfer to the antenna system AS is needed. As shown in FIG. 2, the two coils L1, L2 are now connected in anti-series, i.e. terminal T21 will be connected to terminal T22. As the coil area vectors $a_1$, $a_2$ are now oriented in opposite directions and equal in magnitude, the net flux through the combined antennas will be zero as well as the voltage seen at the output terminals T1, T2. In this situation any external magnetic field cannot transmit power to the coil and any damage to the device or the patient is avoided.

Several embodiments of the invention are possible. On top of the one schematically shown in FIGS. 1 and 2, a coil can be divided in any convenient even number of sub-coils having the same value of the flux surface which are then connected electrically in series or in anti-series to obtain an operational or a safety mode. The sub-coils can be of any convenient shape, not only round, and their centroids need not to be superimposed, as long as the magnetic field can be considered approximately constant in the whole volume occupied by the coils and the coil area vectors a have the same value and point in the same direction. For instance, two identical sub-coils can be arranged side-by-side, with the coil area vectors a being parallel.

Figure 3:
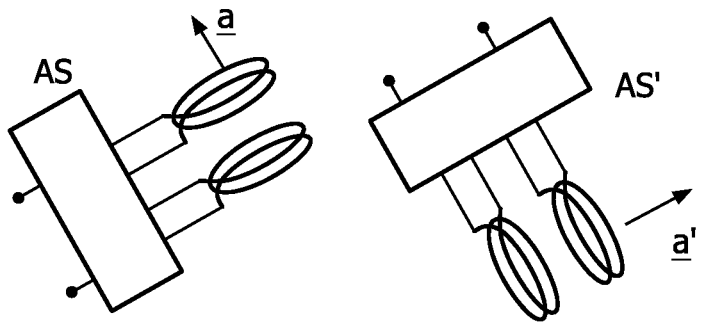
FIG. 3 shows an antenna arrangement comprising two antenna systems of the kind depicted in FIGS. 1 and 2.

Even more generally, an antenna arrangement like that shown in FIG. 3 can consist of several antenna systems AS, AS', . . . containing even numbers of sub-coils, wherein each sub-coil in an antenna system AS, AS' has a coil area vector a, a' pointing in the same direction and sharing the same value. The sub-coils belonging to each antenna system AS, AS' are arranged in series or anti-series to achieve an operational or a safety mode. Preferably the coil area vectors a, a' of the different antenna systems AS, AS' point in different directions. This ensures that in safety mode, in case of imperfect design of the antenna systems AS, AS', the upper limit for the residual induced voltage is smaller than with all coil area vectors in the same direction. On the other hand this arrangement makes the power transfer from a charger coil to the device less sensitive to potential orthogonal placement between implanted sub-coil and external coil.

More complex arrangements where not all sub-coils have the same value of the coil area vector can also be considered as embodiment of the invention, as will be clear to the person skilled in the art.

Figure 4:
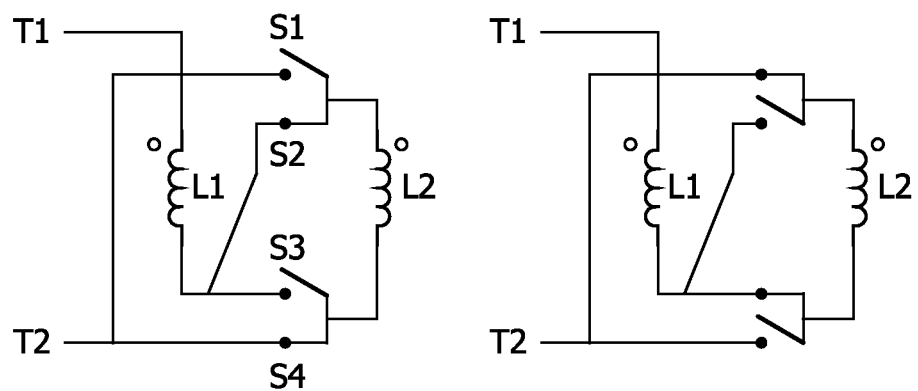
FIG. 4 shows a possible realization of a control circuit in the operational mode (left) and safety mode (right)

There are many possible ways to realize the reconfigurable connection between terminals T11, T21, T12, T22 that is schematically shown in FIGS. 1 and 2. One possibility is shown in FIG. 4. The switches S in this control circuit CC can be realized with solid-state devices like MOSFETs, BJTs, IGFETs, PIN-diodes, SCRs and similar, or with micromechanical (MEMS) switches, or with relays, reed relays and (micro) vacuum tubes. In the case of micro-mechanical switches, bi-stable switches will be preferred, as they can keep active or interrupted the connection without the need to keep a power supply. This could be especially attractive to ensure safety.

In further embodiments of the invention the antenna system can be put into an operational mode or into a safety mode by a command received (via radio) with a receiver RC in the control circuit CC from an external "mode selection device" (e.g. a charger, that puts the implanted device in operational mode when charging is needed and puts it back in safety mode as soon as the charging is completed). The implanted system may return in safety mode after an explicit external command or on its own initiative, e.g. after an appropriate delay time is elapsed since the last command putting the implant in operational mode or after a certain time is elapsed while no power has been received by the loop antenna.

Moreover, the control circuit CC may comprise a sensor unit SU for detecting if some parameter of an external magnetic field exceeds a predetermined magnitude, which could then trigger an automatic transition of the antenna system into the safety mode. Alternatively or additionally, the system can also automatically be switched to operational mode depending on the values of the external field, e.g. if the external magnetic field variation is not too strong.

Figure 5:
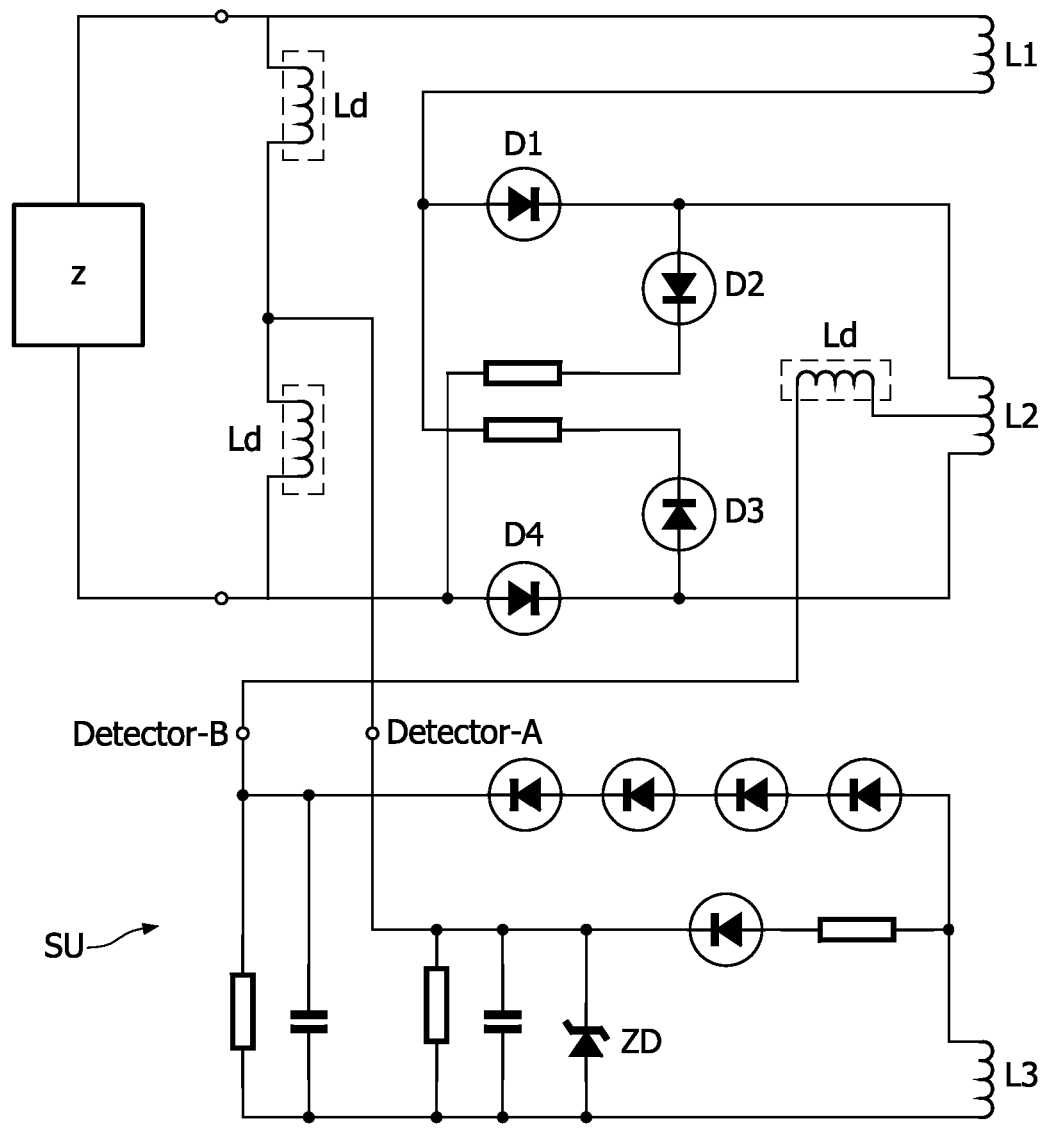
FIG. 5 shows a possible realization of a control circuit that automatically switches between operational and safety mode based on the level of induced voltage.

FIG. 5 shows a possible embodiment of the aforementioned concept of an automated safety switch, in which the lower part of the circuit (with coil L3) has the role of the sensor unit SU.

The switches that are indicated in FIGS. 1 and 2 in the control circuit CC are implemented here with the four diodes D1-D4 shown in the upper part of the circuit of FIG. 5. An additional detection coil L3 was added to provide the powering of the automated safety switch. A device (e.g. a battery) that shall be charged in the operational mode is denoted with Z.

The coils L1 and L2 comprise the active antenna. The induced EMF in the additional detection coil L3 should be chosen such that it is significantly below that induced in the active antennas L1 and L2.

In the lower circuit part SU, two AM detector circuits A and B are connected to the detection coil L3, wherein detector A is activated at lower modulation depth than detector B. The circuit should be dimensioned in such a way that:
1. For charging the device Z the applied field strength should be such that detector A is activated but not saturated.
2. For charging the device Z the applied field strength should be such that detector B is not activated (induced voltage in L3 is below the threshold of the diode voltage for detector B).
3. The safety mode is activated automatically when the applied field strength is such that detector B is activated. At the level that detector B is activated, detector A is saturated and the detected voltage will be limited by the shown Zener diode ZD.
4. The shown RF-decoupling inductors Ld are sufficiently high impedance that they block RF-current and do not basically change the behavior of the antenna or power flow.

In operational mode, the potential of detector A is higher than that of detector B. This results in a reverse bias on crossing PIN-diodes D2, D3 and a forward bias through the in-line pin-diodes D1, D4. Those forward biased in-line pin-diodes act as shorts for RF currents. The voltage induced in the active antennas L1 and L2 is put in series and is present at the terminals of the device Z.

If the applied field is so high that a potentially dangerous voltage would be present on the terminals of device Z, detector A is saturated (its voltage is limited to the value of the Zener diode) and detector B is activated. Now the potential of detector B is higher than the potential of detector A. As a result the in-line pin-diodes D1, D4 are in reverse bias and the crossing pin-diodes D2, D3 are forward biased. The resistors put in series with the crossing pin-diodes should limit the bias current since there is no saturation circuit implemented for detector B in this embodiment (although this can be done as well). Now the induced voltages in the antennas L1 and L2 are placed in anti-series and no net induced voltage is present on the terminals of device Z.

The invention can be advantageously applied to any implantable therapeutic device having a coil, particularly a coil used to recharge the device itself using RF power. The use of the invention improves considerably the safety of this kind of devices against (electro)magnetic interference generated by MR imagers or in general by the presence of other strong variable magnetic fields (e.g. de-activation devices for anti-theft stickers in retails shops). Existing implantable devices that are RF rechargeable are Cochlear Implants, stimulators for the Spinal Cord and miniature neural stimulators (e.g. Bion®, Advanced Bionics Corp., Valencia, USA). In the future more kinds of implantable neurostimulators and even cardiac rhythm management devices (like cardiac pacemakers) are expected to become RF rechargeable.

The invention can also be applied to MR scanning devices, which may detect the presence of the implantable device on the basis of a specific RF communication protocol (or on the basis of some other measurement) and may then put the detected device in safety mode before effectively starting to send a dangerous magnetic field to the volume occupied by the implant.

Finally it is pointed out that in the present application the term "comprising" does not exclude other elements or steps, that "a" or "an" does not exclude a plurality, and that a single processor or other unit may fulfill the functions of several means. The invention resides in each and every novel characteristic feature and each and every combination of characteristic features. Moreover, reference signs in the claims shall not be construed as limiting their scope.

The invention claimed is:

1. An antenna system for protecting an implantable device against damage from excessive external magnetic fields, the antenna system comprising:
   one or more antennas, each having at least two coil units with two terminals each; and
   a control circuit for selectively switching the implantable device between operational and safety modes, in the operational mode the coil units are connected in series with respect to voltages induced by a magnetic field to generate maximal voltage, and in the safety mode the coil units are connected in anti-series with respect to said induced voltages to generate minimal voltage,
   wherein in the safety mode the implantable device is protected from damage from the excessive external magnetic field.

2. The antenna system according to claim 1, wherein the coil units comprise coil area vectors which are parallel and/or equal in magnitude.

3. The antenna system according to claim 1, wherein the control circuit comprises a receiver for receiving external commands.

4. The antenna system according to claim 1, wherein the control circuit comprises a sensor unit for detecting an effect caused by external magnetic fields.

5. The antenna system according to claim 4, wherein the control circuit comprises a sub-circuit for switching into the safety mode if the sensor unit detects an external magnetic field crossing a predetermined threshold in at least one of a plurality of parameters.

6. The antenna system according to claim 1, wherein the control circuit comprises a timer for triggering a return to the safety mode a predetermined time after the start of an operational mode.

7. The antenna system according to claim 1, comprising an identifier module for allowing a wireless identification by external devices.

8. The antenna system according to claim 1, wherein the one or more antennas comprising a plurality of antennas and the coil units of each antenna have parallel coil area vectors and wherein the coil area vectors of different antennas are non-parallel.

9. The antenna system according to claim 1, further comprising an implantable device selected from one of a cardiac pacemaker, a neurostimulator, a drug pump, and a cochlear implant.

10. The antenna system according to claim 1, comprising a mode selection device having a command module for wirelessly commanding the antenna system into the safety mode and/or the operational mode.

11. The antenna system according to claim 10, further comprising a MRI device having the mode selection device.

12. A method for controlling an antenna system of an implantable device to protect the device against damage from excessive external magnetic fields, said antenna system including one or more antennas, each having at least two coil units the method comprising acts of:
   providing a control circuit for selectively switching between operational and safety modes of the implantable device, switching to the operational mode, in which the coil units are connected in series with respect to voltages for inducing a magnetic field to generate maximal voltage, and switching to the safety mode, in which the coil units are connected in anti-series with respect to said induced voltages to generate minimal voltage and to prevent induction of the magnetic field, wherein in the safety mode the implantable device is protected from damage from the excessive external magnetic field.

\* \* \* \* \*